(12) United States Patent
Grudowski et al.

(10) Patent No.: US 7,442,598 B2
(45) Date of Patent: Oct. 28, 2008

(54) METHOD OF FORMING AN INTERLAYER DIELECTRIC

(75) Inventors: Paul A. Grudowski, Austin, TX (US); Stanley M. Filipiak, Pflugerville, TX (US); Yongloo Jeon, Austin, TX (US); Chad E. Weintraub, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 397 days.

(21) Appl. No.: 11/148,455

(22) Filed: Jun. 9, 2005

(65) Prior Publication Data

US 2006/0281240 A1    Dec. 14, 2006

(51) Int. Cl.
*H01L 21/8238* (2006.01)
*H01L 21/302* (2006.01)

(52) U.S. Cl. .................. 438/199; 438/197; 438/587; 438/757; 438/791

(58) Field of Classification Search ................. 438/597, 438/197, 199, 587, 757, 791
See application file for complete search history.

(56) References Cited

U.S. PATENT DOCUMENTS 6,933,565 B2 *   8/2005  Matsumoto et al. .......... 257/347
2003/0181005 A1 * 9/2003  Hachimine et al. .......... 438/231
2004/0075148 A1   4/2004  Kumagai et al
2005/0040460 A1 * 2/2005  Chidambarrao et al. ..... 257/336
2005/0040461 A1 * 2/2005  Ono et al. .................... 257/338
2006/0249794 A1 * 11/2006 Teh et al. ..................... 257/369

FOREIGN PATENT DOCUMENTS

WO   WO 2004/049406 A1    6/2004

OTHER PUBLICATIONS

Pidin et al, "A Novel Strain Enhanced CMOS Architecture Using Selectively Deposited High Tensile and High Compressive Silicon Nitride Films", IEDM 2004.
Yang et al, "Dual Stress Liner for High Performance sub-45nm Gate Length SOI CMOS Manufacturing", IEDM 2004.

* cited by examiner

*Primary Examiner*—Thanh Nguyen
(74) *Attorney, Agent, or Firm*—James L. Clingan, Jr.; Daniel D. Hill

(57) ABSTRACT

A method for forming a semiconductor device comprises providing a semiconductor substrate; forming a first stressor layer over a surface of the semiconductor substrate; selectively removing portions of the first stressor layer; forming a second stressor layer over the surface of the semiconductor substrate and the first stressor layer; and selectively removing portions of the second stressor layer using an isotropic etch. In one embodiment, the isotropic etch is a wet etch that selectively removes the second stressor layer without removing a significant amount of the first stressor layer and also planarizing a boundary between the first stressor layer and the second stressor layer.

15 Claims, 5 Drawing Sheets

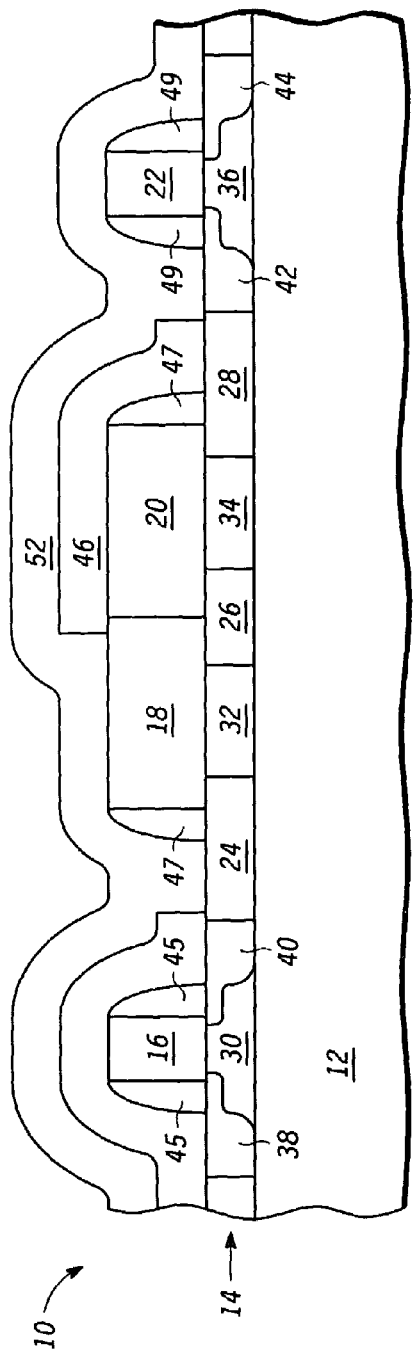
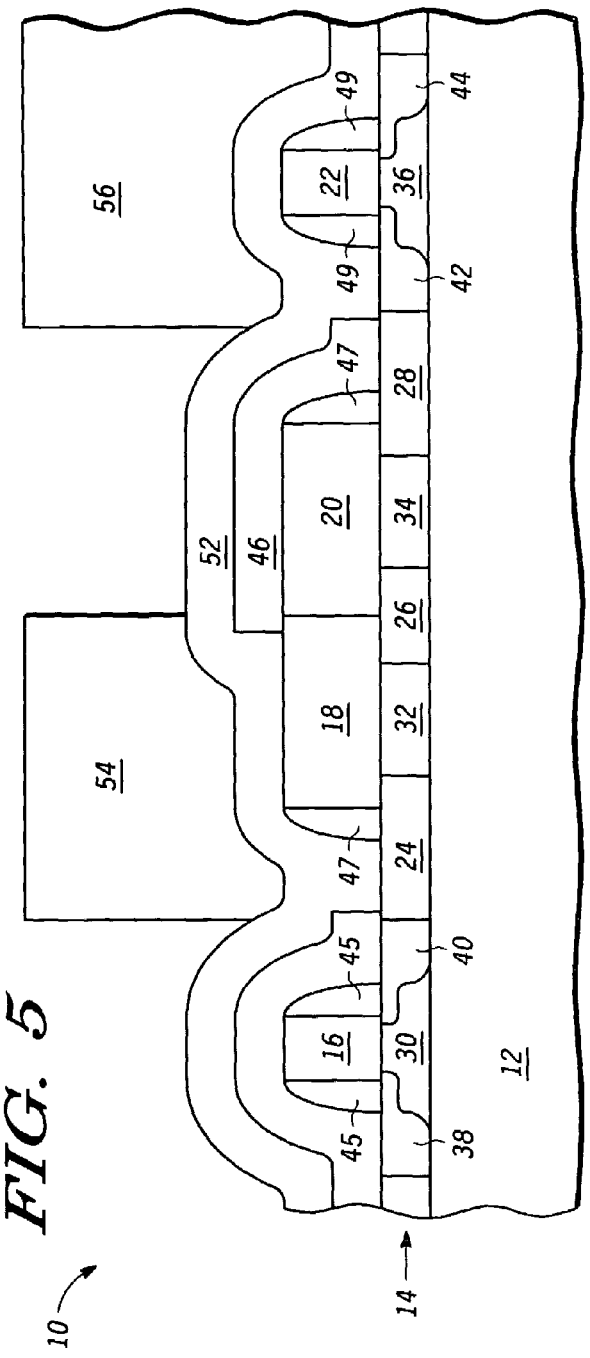
FIG. 5
FIG. 6

US 7,442,598 B2

METHOD OF FORMING AN INTERLAYER DIELECTRIC

FIELD OF THE INVENTION

This invention relates to integrated circuits, and more particularly to integrated circuits having an interlayer dielectric between conductive layers.

BACKGROUND OF THE INVENTION

Interlayer dielectrics (ILDs) are used to separate conductive layers, but they must also be able to provide a way for selective connection between conductive layers. In inlaid processes, vias are typically formed through the ILD to the lower layer. In order to not overetch, the lowest portion of the ILD is an etch stop layer. Various forms of silicon nitride have been found to be effective for this purpose. Examples of such silicon nitrides include silicon oxynitride, silicon-rich silicon nitride, and stoichiometric silicon nitride. One of the characteristics of silicon nitride is that its stress is selectable. Thus, it can be either tensile or compressive. The stress of the silicon nitride, especially when the underlying conductive layer is the polysilicon layer that forms gates, has found to assist in improving the mobility of transistors. Generally, a tensile stress helps the mobility of the N channel transistors, and a compressive stress helps the mobility of the P channel transistors. Thus, a choice had to be made as to which transistor type would have improved mobility and to what extent and at what cost to the performance of the other transistor type. Thus, the concept of having tensile-stress silicon nitride over the N channel transistors and compressive-stress silicon nitride over the P channel transistors has been set forth. Practical implementation, however, has been more difficult.

Thus, there is a need for overcoming one or more of the difficulties in bringing dual-stress silicon nitride into practical implementation.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 5 is a cross section of the semiconductor device of FIG. 4 at a subsequent stage of the process to that shown in FIG. 4;

FIG. 6 is a cross section of the semiconductor device of FIG. 5 at a subsequent stage of the process to that shown in FIG. 5;

DETAILED DESCRIPTION OF THE INVENTION

In one aspect an interlayer dielectric is formed having an underlying silicon nitride layer having portions with different stresses and a thicker overlying dielectric portion. The underlying silicon nitride is formed by depositing a first silicon nitride layer of one stress type and selectively removing it from over one type of transistor. A second silicon nitride layer of the other stress type is then deposited and selectively removed. Due to mask alignment difficulties that are a practical reality, a typical etch would result in an overlap at the boundary of the two silicon nitride layers. In this case, however, the etch of the second silicon nitride layer is isotropic and uses a chemistry that is selective between the first and second silicon nitride layers. The result is a relatively planar silicon nitride layer made up of the first and second silicon nitride. This is better understood with reference to the drawings and the following description.

Figure 1:
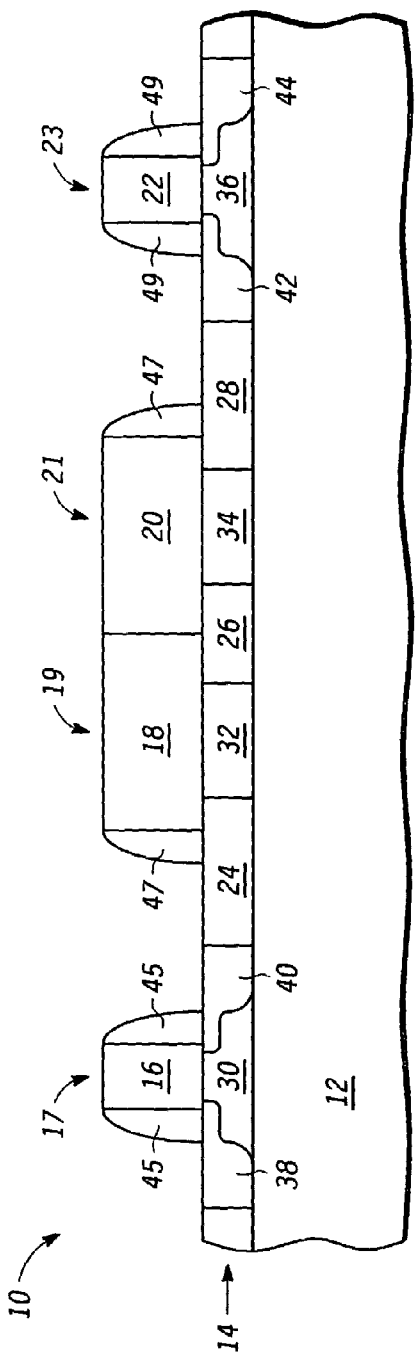
FIG. 1 is a cross section of a semiconductor device at a stage in a process in which the process is an embodiment of the invention.

Shown in FIG. 1 is a semiconductor device 10 comprising a supporting substrate 12, a semiconductor layer 14 on substrate 12, a P-doped gate 16, an N-doped gate 18, a P-doped gate 20, an N-doped gate 22, a sidewall spacer 45 around gate 16, a sidewall spacer 48 around gates 18 and 20, and a sidewall spacer 49 around gate 22. Formed in semiconductor layer 14 are an isolation region 24, and isolation region 26, an isolation region 28, a N-type body region 30, an P-type body region 32, a N-type body region 34, an P-type body region 36, a source/drain region 38, a source/drain region 40, a source/drain region 42, and a source/drain region 44.

Semiconductor layer 14 and supporting substrate 12 together form a semiconductor-on-insulator (SOI) substrate. Semiconductor layer 14 is preferably monocrystalline silicon of about 50 nanometers (nm) in thickness but could be a different material. Supporting substrate is preferably a relatively thick oxide layer adjacent to semiconductor layer 14 and a relatively thick silicon layer adjacent to the relatively thick oxide layer. Gates 16, 18, 20, and 22, of polysilicon in this example, are separated from semiconductor layer 14 by a gate dielectric that is not shown. Gates 18 and 20 comprise a continuous material but are doped differently. Sidewall spacers 46, 48, and 50 are preferably insulators and typically of multiple layers. Isolation regions 24, 26, and 28 are preferably silicon oxide that replaces the semiconductor material of semiconductor layer 14 in those locations. N-type body regions 30 and 34, in addition to being of the N-type, have been doped additionally as desired. Such additional dopings may include, for example, a halo implant and a threshold adjust implant. Isolation regions 24, 26, and 28 in this example are shallow trench isolation but another type of isolation could be used.

Source/drain regions 38 and 40 along with gate 16 comprise a P channel transistor 17. Body region 30 between source/drains 38 and 40 provides a channel for transistor 17. Similarly, source/drain regions 42 and 44 along with gate 22 form an N channel transistor 23. Body region 36 provides a channel for transistor 23. Body regions 30 and 36 show a channel length of transistors 17 and 23. Body region 32, on the other hand, shows a channel width of a transistor 19 of which gate 18 is the gate. The source/drains of transistor 19 are not visible in FIG. 1 because the channel direction is orthogonal to the channel direction of transistors 17 and 23. Similarly, body region 34 shows a channel width of a transistor 21 of which gate 20 is the gate. As for transistor 19, the source/drains of transistor 21 are not visible in this cross section. The channel direction for transistors 17 and 23 is <110> as is the channel direction of transistors 19 and 21. On the surface of semiconductor layer 14 at source/drains 38, 40, 42 and 44 is a silicide. Similarly gates 16, 18, 20, and 22 have a silicide top coating as well. This silicide, although not shown, is useful for contacts and shorting the PN junction at the boundary between gates 18 and 20.

Figure 2:
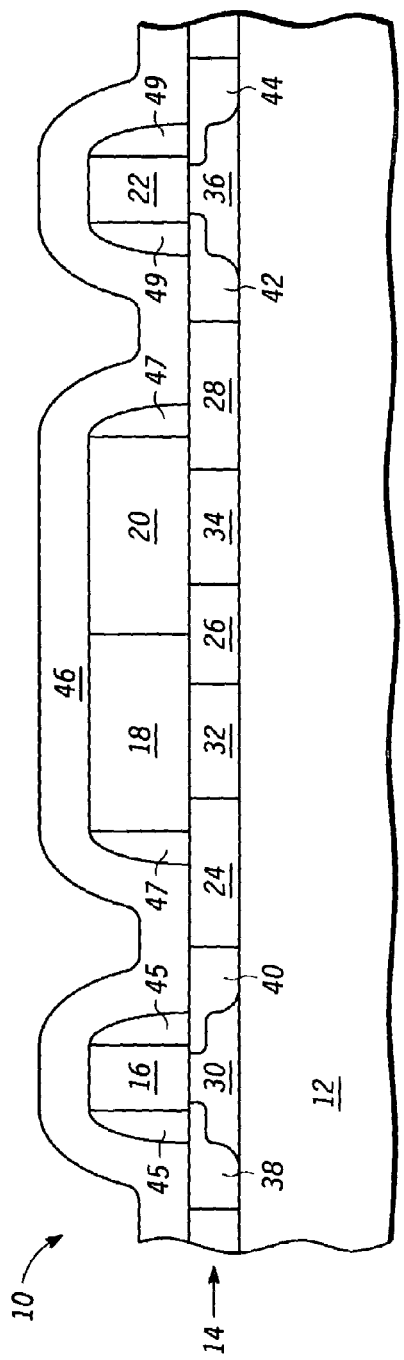
FIG. 2 is a cross section of the semiconductor device of FIG. 1 at a subsequent stage of the process to that shown in FIG. 1.

Shown in FIG. 2 is semiconductor 10 after deposition of a silicon nitride layer 46 which has a compressive stress for its function as a stressor layer. It also functions as an etch stop layer in conventional fashion but the stress is not particularly relevant to the etch stop function. The deposition of silicon nitride layer 46 is preferably done using conventional plasma-enhanced chemical vapor deposition (PECVD). The manner by which a silicon nitride layer is made tensile or compressive using PECVD and the degree to which that is done is well understood in the art. Silicon nitride layer 46 in this example is substantially conformal with a thickness of about 80 nm, but a range of 30-100 nm is known to be effective for this purpose. Silicon nitride layer 46 has a concentration of silicon a little less than that of stoichiometric silicon nitride and can be called silicon-lean silicon nitride.

Figure 3:
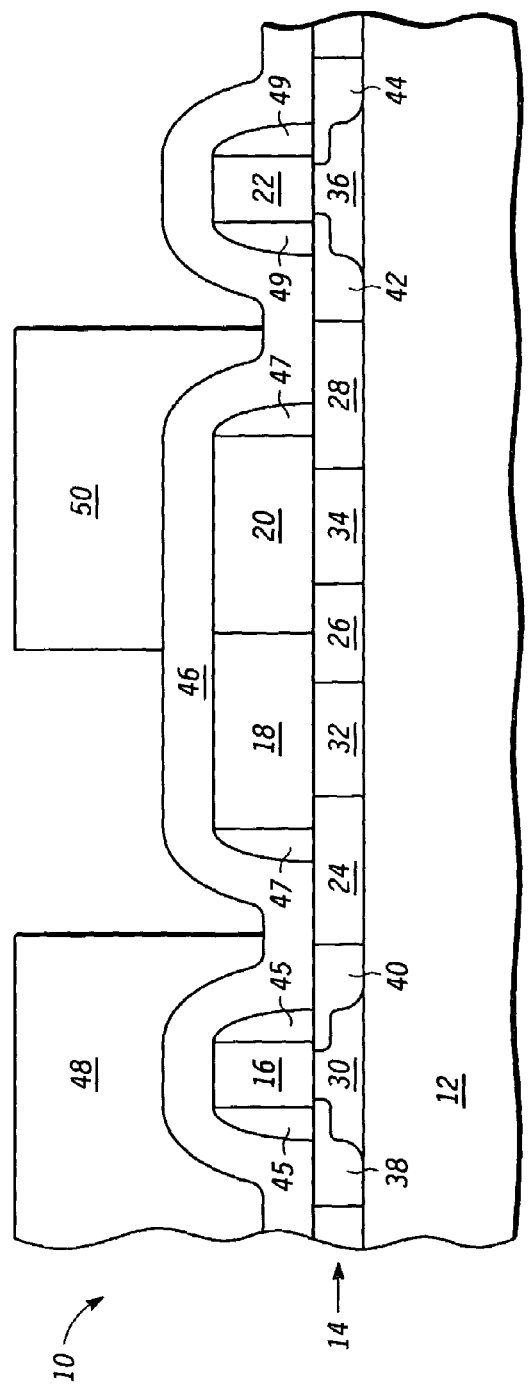
FIG. 3 is a cross section of the semiconductor device of FIG. 2 at a subsequent stage of the process to that shown in FIG. 2.

Shown in FIG. 3 is semiconductor 10 after depositing and patterning a photoresist layer to result in photoresist portions 48 and 50 over P channel transistors 17 and 21 and exposing silicon nitride layer 46 over N channel transistors.

Figure 4:
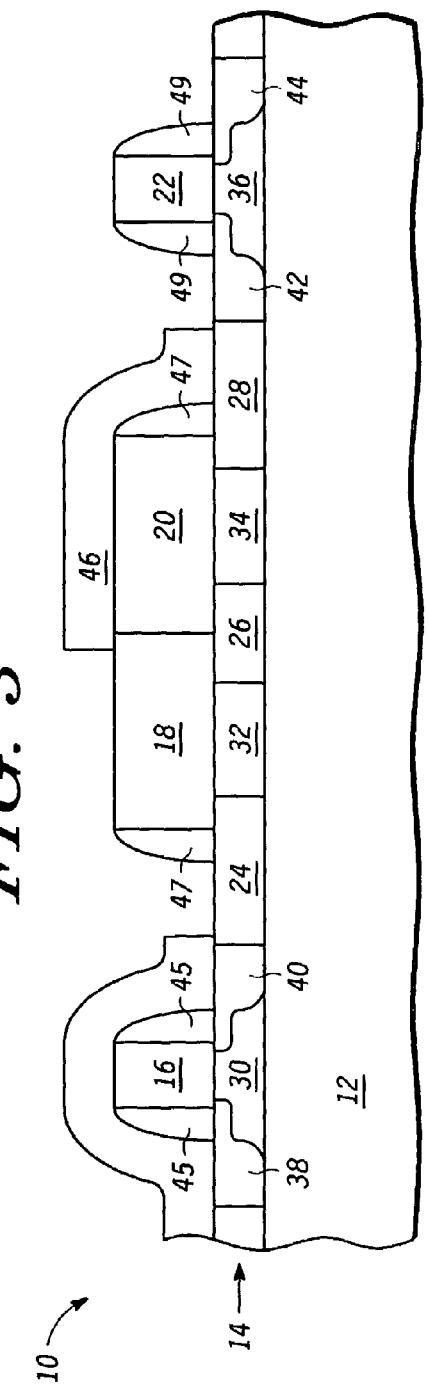
FIG. 4 is a cross section of the semiconductor device of FIG. 3 at a subsequent stage of the process to that shown in FIG. 3.

Shown in FIG. 4 is semiconductor device 10 after etching silicon nitride layer 46 so that silicon nitride layer 46 is removed from over N channel transistors 17 and 21 and is left over P channel transistors 17 and 21. This etch is a dry anisotropic etch performed using reactive ion etching (RIE) which is typical etching for silicon nitride. This fulfills the role of adding compressive stress to the P channel transistors to increase their mobility.

Shown in FIG. 5 is semiconductor device 10 after depositing a silicon nitride layer 52 over transistors 17, 19, 21, and 23 by PEOVD to be silicon-lean, relatively conformal, about 80 nm, and tensile by the appropriate choice of parameters as is well understood in the art. Silicon nitride layer 52 functions both as a stressor layer and an etch stop layer.

Shown in FIG. 6 is semiconductor 10 after depositing a photoresist layer on silicon nitride layer 52 and selectively etching it to leave photoresist portions 54 and 56 over N channel transistors 19 and 23. Photoresist portions 54 and 56 overlap the portion of silicon nitride layer 46 that is remaining. This is due to alignment tolerances.

Figure 7:
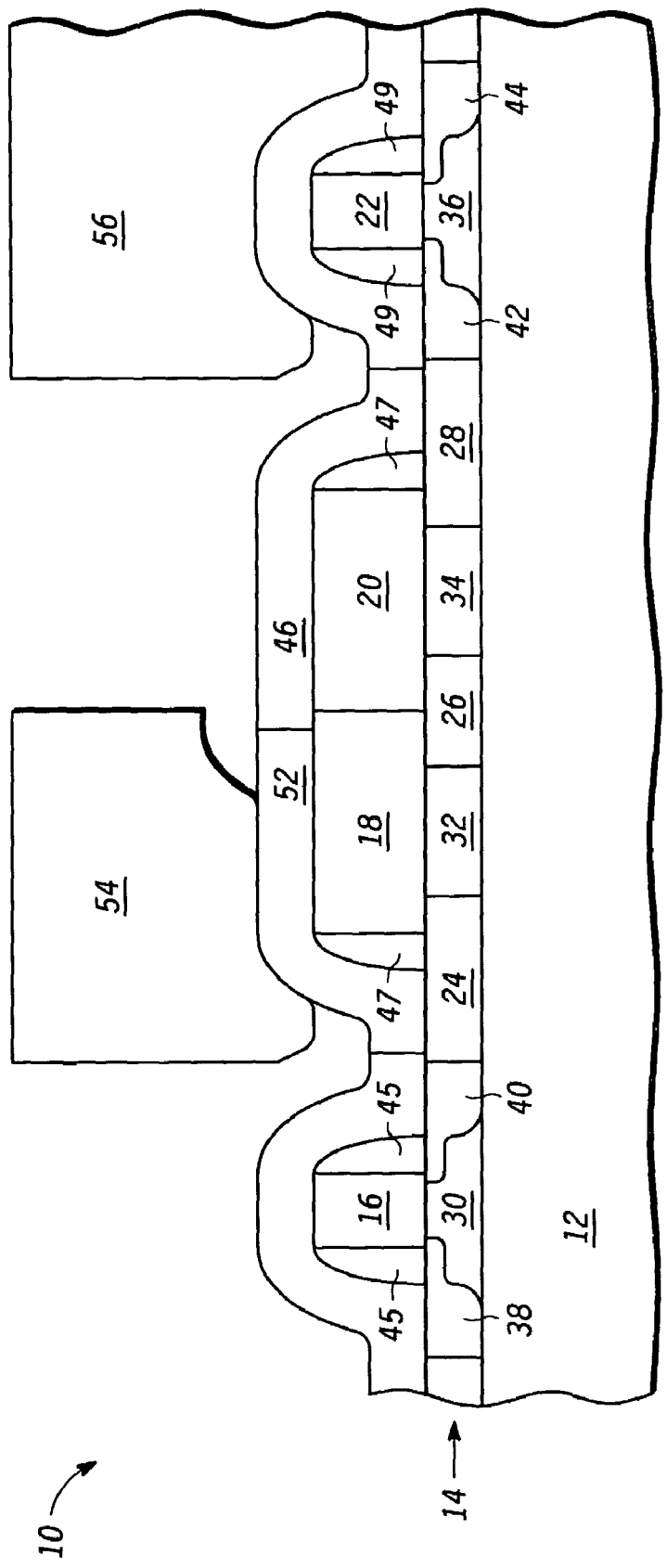
FIG. 7 is a cross section of the semiconductor device of FIG. 6 at a subsequent stage of the process to that shown in FIG. 6.

Shown in FIG. 7 is semiconductor 10 after etching silicon nitride layer 52 isotropically using photoresist portions 54 and 56 as a mask. This etch is performed using a wet chemistry. Wet chemistry is convenient for performing an isotropic etch. In this example the wet chemistry is a solution of 100 to 1 water to hydrofluoric acid (HF). This would more commonly be called simply hundred to one HF. This has been found to have a high degree of selectivity between tensile silicon nitride and compressive silicon nitride when both are silicon-lean. This selectivity has been found to be about 12 to 1. Thus the etch nearly stops on silicon layer 46 while continuing to etch layer 52 both down and laterally.

Figure 8:
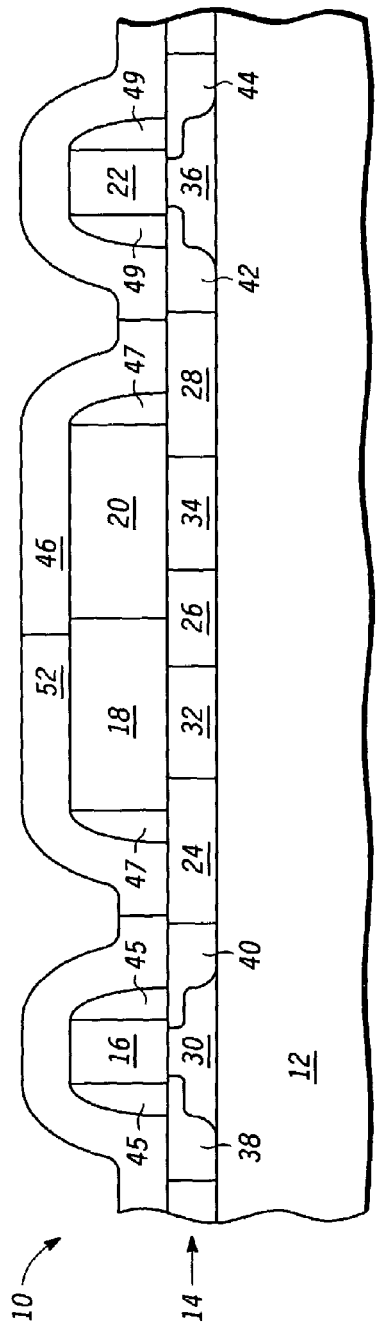
FIG. 8 is a cross section of the semiconductor device of FIG. 7 at a subsequent stage of the process to that shown in FIG. 7.

Shown in FIG. 8 is semiconductor 10 after the removal of photoresist portions 54 and 56. This leaves a relatively uniform single layer of nitride made up of two different layers of different stresses. This method thus avoids both the problem of the two types of silicon nitride layers being separated so there is a gap between them and the problem of one layer overlapping the other.

Figure 9:
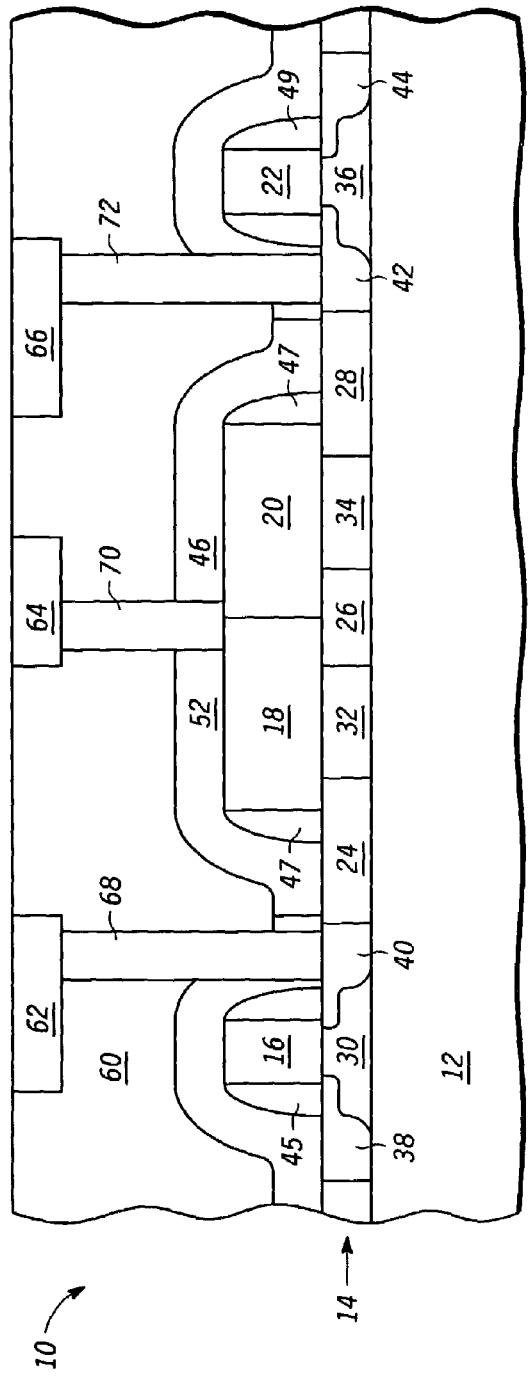
FIG. 9 is a cross section of the semiconductor device of FIG. 8 at a subsequent stage of the process to that shown in FIG. 8.

Shown in FIG. 9 is semiconductor device 10 after formation of a thick dielectric layer 60 and inlaid metal layers 62, 64 and 66 with metal contacts 68, 70, and 72 extending down from them, respectively. Metal contacts 68, 70, and 72 make actual contact with silicide. Metal contact 68 contacts source/drain 40. Metal contact 70 contacts gates 18 and 20 at the boundary between them. Metal contact 72 contacts source/drain region 42. By making contact through non-overlapping silicon nitride layers, the process margin is improved for contacts 68, 70, and 72.

Various changes and modifications to the embodiments herein chosen for purposes of illustration will readily occur to those skilled in the art. For example, other semiconductor materials may be used than silicon. Although hundred to one HF has been found to be particularly effective, another etchant may be found to be effective that is selective between the stressor layers. The stressor layers may be a material different from silicon lean nitride and the order of deposition of tensile and compressive can be reversed. To the extent that such modifications and variations do not depart from the spirit of the invention, they are intended to be included within the scope thereof which is assessed only by a fair interpretation of the following claims.

What is claimed is:

1. A method for forming a semiconductor device comprising:
   providing a semiconductor substrate;
   forming a first stressor layer of silicon-lean silicon nitride over a surface of the semiconductor substrate, wherein the first stressor has compressive stress;
   selectively removing portions of the first stressor layer to leave a remaining portion;
   forming a second stressor layer of silicon-lean silicon nitride over the surface of the semiconductor substrate and the remaining portion of the first stressor layer, wherein the second stressor layer has tensile stress;
   forming a photoresist layer over the second stressor layer;
   patterning the photoresist layer to leave a portion of the photoresist layer that overlaps the remaining portion of the first stressor layer and exposes a first portion of the second stressor layer; and
   applying a wet chemistry comprising hydrofluoric acid to the portion of the photoresist layer and the first portion of the second stressor layer, wherein wet chemistry comprising hydrofluoric acid is characterized by etching the second stressor layer at a greater rate than the first stressor layer.

2. The method of claim 1, wherein the step of applying is further characterized by the greater rate being about 12 to 1.

3. The method of claim 1, wherein the step of applying is further characterized by continuing after the first portion of the second stressor layer has been removed until all of the second stressor layer that is over the remaining portion of the first stressor layer is removed.

4. The method of claim 1, wherein the semiconductor substrate is characterized as being a silicon-on-insulator (SOI) substrate.

5. The method of claim 1, wherein the first and second stressor layers are both formed using plasma enhanced chemical vapor deposition (PECVD).

6. A method for forming a semiconductor device comprising:
   providing a semiconductor substrate;

forming a first plurality of transistors on a first portion of the semiconductor substrate;

forming a second plurality of transistors on a second portion of the semiconductor substrate;

forming a first stressor layer of silicon-lean silicon nitride over the first and second pluralities of transistors having compressive stress;

selectively removing the first stressor layer from over the first plurality of transistors to leave a remaining portion of the first stressor layer;

forming a second stressor layer of silicon-lean silicon nitride over remaining portion of the first stressor layer and the first and second pluralities of transistors, wherein the second stressor layer has tensile stress;

forming a photoresist layer over the second stressor layer;

patterning the photoresist layer to leave a portion of the photoresist layer that overlaps the remaining portion of the first stressor layer and exposes a first portion of the second stressor layer; and applying a wet chemistry comprising hydrofluoric acid to the portion of the of the photoresist layer and the first portion of the second stressor layer, wherein wet chemistry comprising hydrofluoric acid is characterized by etching the second stressor layer at a greater rate than the first stressor layer.

7. The method of claim 6, wherein channel regions of the first and second pluralities of transistors are oriented in a direction in a semiconductor wafer.

8. The method of claim 6, wherein the first plurality of transistors has an N conductivity type and the second plurality of transistors has a P conductivity type.

9. The method of claim 6, wherein the step of applying is further characterized by the greater rate being about 12 to 1.

10. The method of claim 6, wherein portions of the second stressor layer further comprises selectively removing the step of applying is further characterized by continuing after the first portion of the second stressor layer has been removed until all of the second stressor layer that is over the remaining portion of the first stressor layer is removed.

11. The method of claim 6, further comprising forming an electrical contact with at least one transistor of the first or second pluralities of transistors at a boundary between the first stressor layer and the second stressor layer.

12. The method of claim 6, wherein forming the first and second stressor layers comprises forming the first and second stressor layers to be between about 30 and 100 nanometers thick.

13. A method for forming a semiconductor device comprising:

providing a semiconductor substrate;

forming a plurality of N-channel transistors on a first portion of the semiconductor substrate;

forming a plurality of P-channel transistors on a second portion of the semiconductor substrate, wherein the second portion is adjacent to the first portion;

forming a compressive stressor layer of silicon-lean silicon nitride over the plurality of N-channel transistors and over the plurality of P-channel transistors;

selectively removing the compressive stressor layer from over the plurality N-channel of transistors to leave a remaining portion of the compressive stressor layer;

forming a tensile stressor layer of silicon-lean silicon nitride over the remaining portion of the compressive stressor layer and the plurality of P-channel transistors; and forming a photoresist layer over the compressive stressor layer;

patterning the photoresist layer to leave a portion of the photoresist layer that overlaps the remaining portion of the compressive stressor layer and exposes a first portion of the tensile stressor layer; and applying a wet chemistry comprising hydrofluoric acid to the portion of the of the photoresist layer and the first portion of the second stressor layer, wherein wet chemistry comprising hydrofluoric acid is characterized by etching the second stressor layer at a greater rate than the first stressor layer.

14. The method of claim 13, wherein the first portion is isolated from the second portion using shallow trench isolation, and wherein an electrical contact to at least one transistor of the plurality of N-channel transistors or the plurality of P-channel transistors is formed at a boundary between the first and second portions.

15. The method of claim 13 wherein the compressive stressor layer and the tensile stressor layer are both formed using plasma enhanced chemical vapor deposition (PECVD).

\* \* \* \* \*